(12) United States Patent
Oka

(10) Patent No.: US 7,833,826 B2
(45) Date of Patent: Nov. 16, 2010

(54) FILM FORMATION METHOD, THIN-FILM TRANSISTOR AND SOLAR BATTERY

(75) Inventor: Shinsuke Oka, Kanagawa (JP)

(73) Assignee: Tokyo Electron Limited, Tokyo (JP)

( * ) Notice: Subject to any disclaimer, the term of this patent is extended or adjusted under 35 U.S.C. 154(b) by 65 days.

(21) Appl. No.: 12/323,655

(22) Filed: Nov. 26, 2008

(65) Prior Publication Data
US 2009/0140257 A1 Jun. 4, 2009

(30) Foreign Application Priority Data
Nov. 30, 2007 (JP) ............... 2007-310264

(51) Int. Cl.
*H01L 21/00* (2006.01)
(52) U.S. Cl. .......... 438/96; 438/149; 438/162; 438/164; 438/166; 257/E21.413
(58) Field of Classification Search ........... 438/317, 438/320, 475
See application file for complete search history.

(56) References Cited
U.S. PATENT DOCUMENTS
2004/0231590 A1* 11/2004 Ovshinsky ............ 118/718
FOREIGN PATENT DOCUMENTS
JP     6-196701    7/1994
JP     8-148690    6/1996

OTHER PUBLICATIONS

Toshiaki Sasaki, et al., "Plasma semiconductor process engineering-Introduction to Deposition and Etching", with English Translation, First published by Uchida Rokakuho Publishing Co., Ltd., ISBN 4-7536-5048-0 C3055, Jul. 25, 2003, 5 pages.

* cited by examiner

Primary Examiner—N Drew Richards
Assistant Examiner—Kyuong Lee
(74) Attorney, Agent, or Firm—Oblon, Spivak, McClelland, Maier & Neustadt, L.L.P.

(57) ABSTRACT

After a gate oxide film 10 has been formed on a silicon substrate G, a first step of forming a microcrystalline silicon film by high electron density plasma of an electron temperature of 2.0 eV or less and a second step of forming an ultra-microcrystalline silicon film by high electron density plasma of an electron temperature higher than 2.0 eV are repeated. A stacked-layer film 20 of the ultra-microcrystalline silicon film and the microcrystalline silicon film is thereby formed. With the film formation method described above, at least one of an n-channel thin-film transistor and a p-channel thin-film transistor with the stacked-layer film 20 functioned as an active layer may be manufactured.

16 Claims, 11 Drawing Sheets

FIG.5

| | | LOW POWER | HIGH POWER |
|---|---|---|---|
| SINGLE-LAYER FILM (MICROCRYSTALLINE SILICON FILM) | μ-WAVE POWER AND PRESSURE / TFT CHARACTERISTICS | 2kW, 30mTorr | 5kW, 30mTorr |
| | BUFFERED HYDROGEN FLUORIDE RESISTANCE | × | ○ |
| | MOBILITY μ (cm²/Vsec) | 0.010 | 0.55 |
| | log (on/off CURRENT RATIO) | 4.0 | 4.5 |
| STACKED-LAYER FILM (MICROCRYSTALLINE SILICON FILM / ULTRA-MICROCRYSTALLINE SILICON FILM) | μ-WAVE POWER AND PRESSURE / TFT CHARACTERISTICS | REPETITION OF (2kW, 30mTorr, 10sec) → 3kW, 10mTorr, 10sec) | REPETITION OF (5kW, 30mTorr, 10sec) → 3kW, 10mTorr, 10sec) |
| | BUFFERED HYDROGEN FLUORIDE RESISTANCE | ○ | ○ |
| | MOBILITY μ (cm²/Vsec) | 0.65 | TFT NOT OPERATED |
| | log (on/off CURRENT RATIO) | 4.5 | TFT NOT OPERATED |

FIG.6

| PROCESS CONDITIONS | | PLASMA STATE | CRYSTALLINITY | DENSENESS |
|---|---|---|---|---|
| $\mu$-WAVE POWER | PRESSURE | | | |
| ↑ | — | Ne ↑ | ↑ | ↑ |
| — | ↓ | Te ↑ | → | ↑ |
| ↑ | — | H RADICALS ↑ | ↑ | → |

FIG.10

| | TFT CHARACTERISTICS | | DEPOSITION TIME UNDER DEPOSITION CONDITION OF 3 kW, 10 mTorr | |
|---|---|---|---|---|
| | | | 5sec | 10sec |
| DEPOSITION TIME UNDER DEPOSITION CONDITION OF 2 kW, 30 mTorr | 5sec | MOBILITY μ (cm²/Vsec) | 1.20 | 0.12 |
| | | log(on/off CURRENT RATIO) | 4.5 | 4.0 |
| | 10sec | MOBILITY μ (cm²/Vsec) | 0.65 | 0.60 |
| | | log(on/off CURRENT RATIO) | 1.0 | 3.5 |
| | 15sec | MOBILITY μ (cm²/Vsec) | 0.43 | 0.40 |
| | | log(on/off CURRENT RATIO) | 1.0 | 1.0 |

FILM FORMATION METHOD, THIN-FILM TRANSISTOR AND SOLAR BATTERY

CROSS-REFERENCE TO RELATED APPLICATION

The present invention contains subject matter related to Japanese Patent Application JP 2007-310264, filed in the Japan Patent Office on Nov. 30, 2007, the entire contents of which being incorporated herein by reference.

FIELD OF THE INVENTION

The present invention relates to a film formation method. More specifically, the invention relates to a method of forming a film used for a thin-film transistor or a solar battery.

BACKGROUND OF THE INVENTION

Among silicon oxide films used for an active layer of the thin-film transistor are an amorphous silicon film (a-Si), a poly-silicon (Poly-Si) film, and a microcrystalline silicon film (μc-Si). The amorphous silicon film is an amorphous film, the poly-silicon film is a poly-crystal film, and the microcrystalline silicon film is a microcrystalline film. Among these films, the microcrystalline film has a higher mobility than the amorphous film. The microcrystalline film does not necessarily need an annealing process which is essential for formation of the poly-crystal film. Thus, using the microcrystalline film, the thin-film transistor may be manufactured on a target object at a low temperature of 600° C. or less. Based on such a background, in recent years, there has been proposed a thin-film transistor in which a glass substrate having a low melting point is employed as the target object and the microcrystalline film for improving an operating speed of the transistor is formed as the active layer on the target object.

SUMMARY OF THE INVENTION

However, since crystal grains of the microcrystalline film grow in a columnar manner, physical and electrical bonding between the crystal grains is weakened. For this reason, as shown about the microcrystalline film (single-layer film) and mobility in an upper portion of FIG. 14, a barrier h is present at a grain boundary between adjacent ones of the crystal grains. For this reason, when a carrier composed of an electron and hole moves across the grain boundary of the microcrystalline film, electrical resistance in a horizontal direction of the film increases. Whenever the carrier traverses the barrier h, a mobility μ is reduced. An operation of the thin-film transistor is thereby delayed. As a result of this delay, operation characteristics of the thin-film transistor are rendered unstable.

Further, when the bonding between the crystal grains is weakened, an HF chemical solution such as buffered hydrogen fluoride (BHF) used when a resist film is removed during manufacture of the thin-film transistor enters into the base of the microcrystalline film, after having passed through the grain boundaries as shown about the microcrystalline film (single-layer film) and the BHF in a lower portion of FIG. 14. In this case, the microcrystalline silicon film is not etched by the BHF. However, a glass substrate G, which is the base of the microcrystalline film, is etched. As a result, the microcrystalline silicon film may be lifted off from the substrate, and may finally come off from the substrate. The transistor may be thereby difficult to manufacture. As described above, the bonding between the crystal grains in the horizontal direction is weak in the microcrystalline film in the past. Thus, electrical and physical characteristics of the thin-film transistor deteriorate at the grain boundaries.

In view of the issue described above, the present invention provides a method of forming a microcrystalline silicon film of which electrical and physical characteristics are rendered satisfactory by improving a horizontal bonding strength between crystal grains that form the microcrystalline film.

In order to solve the issue described above, there is provided a film formation method of forming a film used for at least one of an n-channel thin-film transistor, a p-channel thin-film transistor and a solar battery. The method may include:

a first step of forming a microcrystalline silicon film by high electron density plasma of a predetermined electron temperature or less; and a second step of forming an ultra-microcrystalline silicon film by high electron density plasma of an electron temperature higher than the predetermined electron temperature.

As described above, since the crystal grains of the microcrystalline film of the single layer grow in the columnar manner, the horizontal bonding between the crystal grains is weak. Accordingly, the base of the microcrystalline film may be etched by the chemical solution that has entered from the grain boundaries into the base through the microcrystalline film. Then, the microcrystalline film may be lifted off. Manufacture of the transistor may be thereby rendered difficult, or the operation characteristics such as the mobility or an on/off current ratio of the manufactured transistor may deteriorate in the vicinity of the grain boundaries.

On contrast therewith, according to the configuration of the present invention, the high electron density plasma of the predetermined electron temperature or less is employed for formation of the microcrystalline silicon film. Then, for formation of the ultra-microcrystalline silicon film deposited on the microcrystalline silicon film, the high electron density plasma of the higher electron temperature than the microcrystalline silicon film is employed.

With this arrangement, electrical and physical bonding between crystal grains in the horizontal direction is strengthened by the stacked-layer film of the microcrystalline film and the ultra-microcrystalline film. The operation characteristics of the TFT may be thereby improved. Further, the substrate, which is the base of the microcrystalline silicon film may be prevented from being etched by the chemical solution. The TFT may be thereby stably manufactured.

BRIEF DESCRIPTION OF THE DRAWINGS

FIG. 5 is a table showing TFT characteristic results of single-layer films and stacked-layer films in the first embodiment;

FIG. 6 is a table showing relative relationships among respective process conditions and crystallinity and denseness of each film in the first and second embodiments;

FIG. 10 a table showing TFT characteristic results of stacked-layer films in the second embodiment;

DESCRIPTION OF THE EMBODIMENTS

Figure 1:
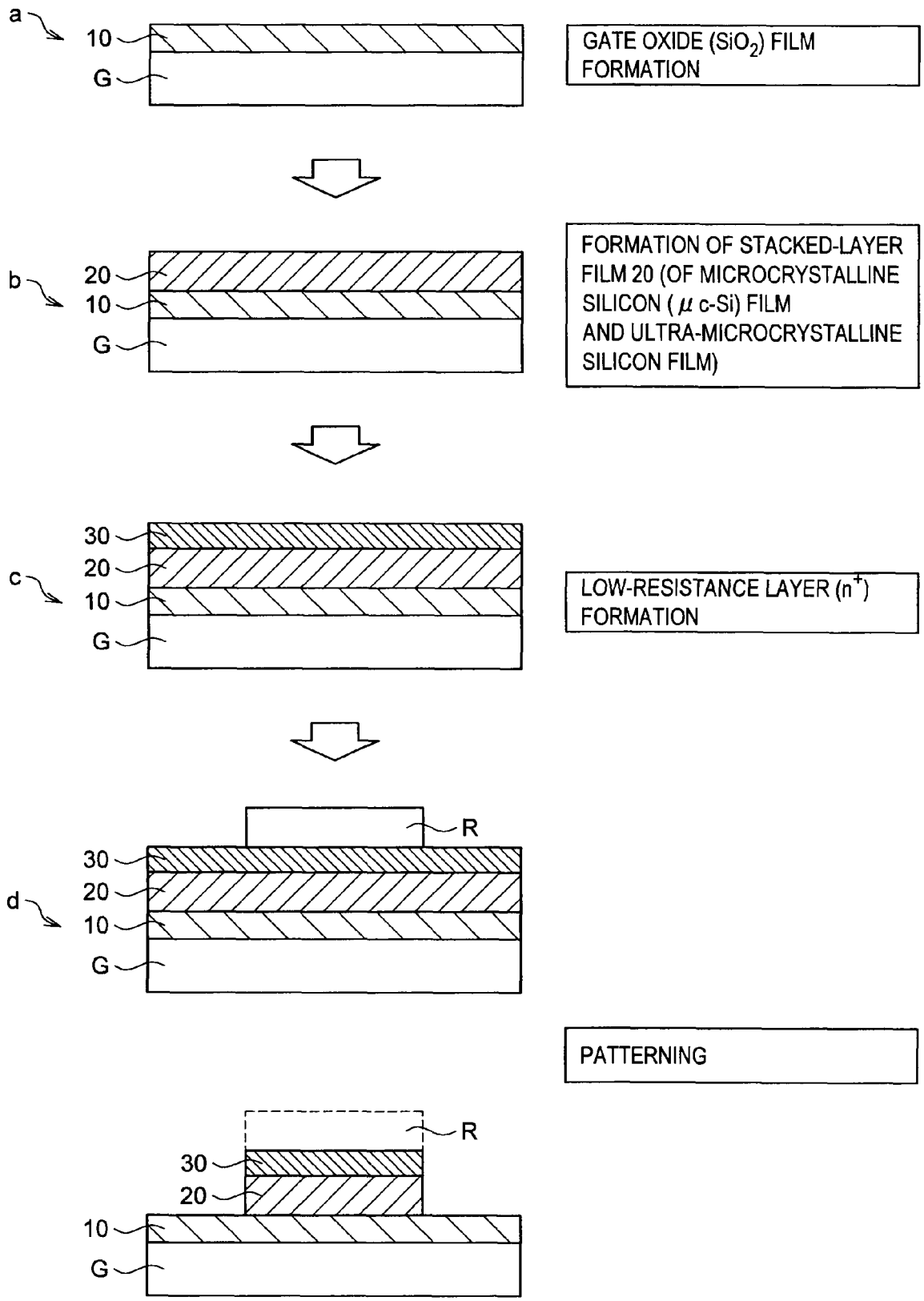
FIG. 1 includes sectional views of a TFT showing processes of a film formation method according to first and second embodiments.

A method of forming a film of a thin-film transistor (TFT) according to a first embodiment of the present invention will be described below in detail with reference to appended drawings.

Note that, in this specification and the appended drawings, structural elements that have substantially the same function and structure are denoted with the same reference numerals, and repeated explanation of these structural elements is omitted. Herein, 1 sccm at 0° C. and 1 atom is $10^{-6}/60$ (m$^3$/sec), and 1 mTorr is $10^{-3} \times 101325/760$ (Pa).

First Embodiment

Figure 2:
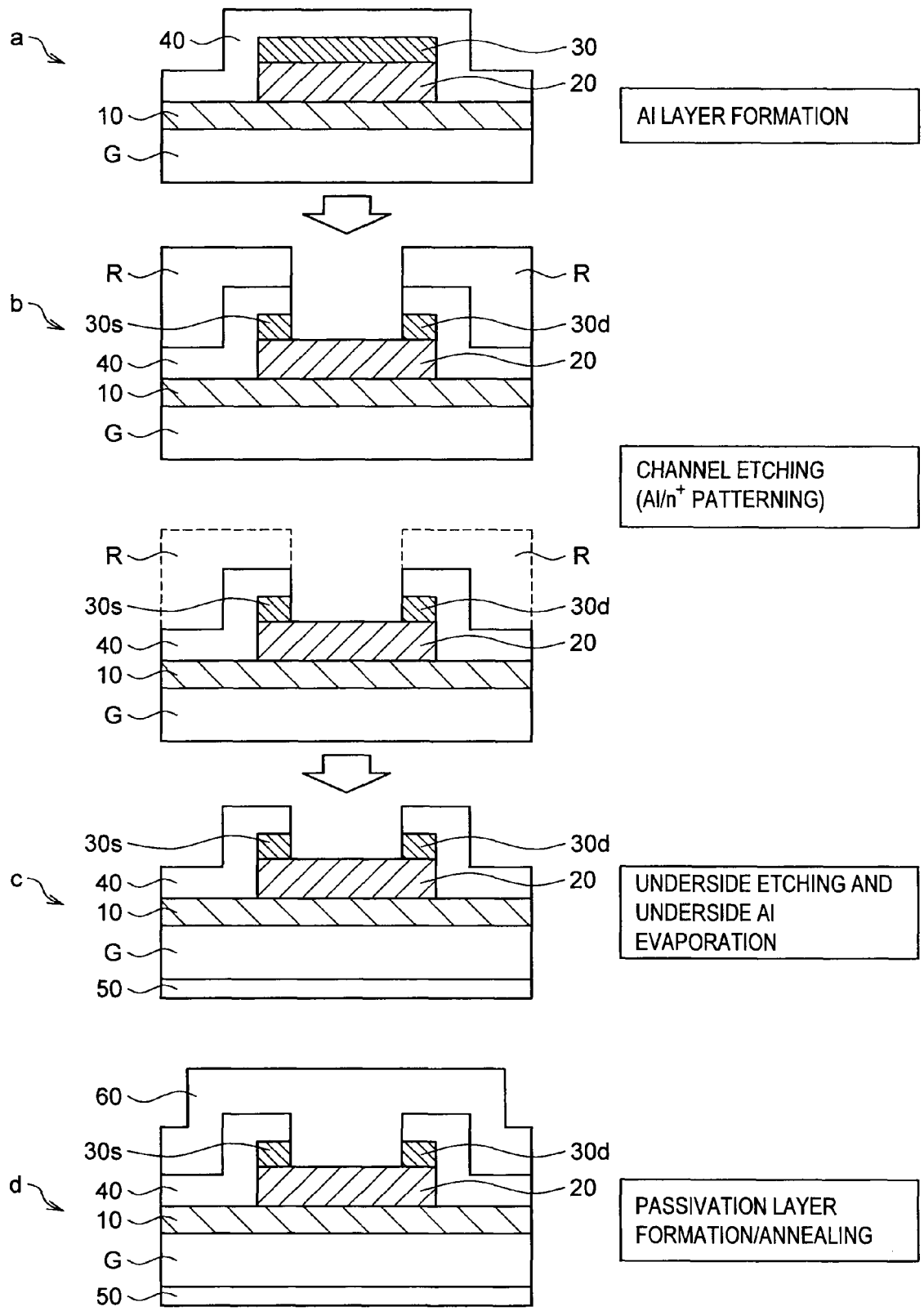
FIG. 2 includes sectional views of the TFT showing processes of the film formation method according to the first and second embodiments following the processes in FIGS. 1A to 1D.

In a TFT manufacturing process in this embodiment, a bottom-gate type TFT (doped silicon substrate) where a gate electrode is disposed below a microcrystalline silicon film is manufactured. The microcrystalline silicon film is formed as an active layer. In FIGS. 1 and 2, a bottom-gate type TFT manufacturing process is illustrated. In FIGS. 1 and 2, respective steps of the process of manufacturing the TFT of an n-channel type are shown. When an impurity to be doped is changed, the TFT of a p-channel type may be manufactured, using the respective steps in FIGS. 1 and 2.

1. Gate Oxide Film Formation

In the bottom-gate type TFT manufacturing process, a gate oxide (SiO$_2$) film 10 is first formed on a silicon substrate G, in step a in FIG. 1. The gate oxide film 10 is deposited on the silicon substrate G into which phosphor (P) has been doped. The doped silicon film is a low-resistance layer (n$^+$). The gate oxide film 10 is deposited to a thickness of 100 nm with plasma under low pressure by chemical vapor deposition (CVD). The plasma is generated by excitation of a mixture gas of silane (SiH$_4$) and oxygen (O$_2$) under a condition of a low pressure and a substrate temperature of 400° C. The silicon substrate G functions as the gate electrode, and the gate oxide film 10 functions as a gate insulating film.

2. Microcrystalline Silicon Film Formation

Next, as shown in step b in FIG. 1, a stacked-layer film 20 of the microcrystalline silicon (μc-Si) film and an ultra-microcrystalline silicon film is deposited on the gate oxide film 10 to a thickness of 100 nm with plasma generated by CVD using microwave under low pressure.

In this case, an electron density N$_e$ of the plasma is $1 \times 10^{11}$ cm$^{-3}$ or higher, which means that the used plasma is high electron density plasma. Then, an electron temperature T$_e$ of the plasma is 2.0 eV or less. As described above, in the microwave plasma, the electron density N$_e$ of the plasma is higher than capacitive coupling plasma, but the electron temperature T$_e$ of the plasma is low. Thus, a processing gas is not excessively ionized, and ion radiation energy onto the substrate is also small. As a result, the film of good-quality may be deposited by fast plasma processing without applying the damage to the substrate.

Since the stacked-layer film 20 formed by the high electron density plasma is excellent in its crystallinity, the stacked-layer film 20 does not need an annealing step or a laser recrystalization step. Accordingly, use of the stacked-layer film 20 for a channel region of the TFT may omit the annealing step while achieving a higher carrier mobility of the TFT than with an amorphous silicon film and excellent operation characteristics of the TFT accompanying the higher carrier mobility. As a result, throughput improvement and cost reduction may be achieved. The structure and characteristics of the stacked-layer film 20 will be described later.

3. Low-resistance Layer (n$^+$) Formation

Next, as shown in step c in FIG. 1, a doped silicon film (low-resistance layer (n$^+$)) 30 is deposited to a thickness of 100 nm. The doped silicon film is obtained by setting the substrate temperature to 300° C., and exciting a mixture gas of silane and hydrogen, thereby generating plasma, and then doping phosphor (P), for example. The low-resistance layer (n$^+$) 30 functions as source and drain regions.

4. Patterning

After formation of the low-resistance layer 30, using a patterned resist film R, the stacked-layer film 20 and the low-resistance layer 30 are patterned in an island form, as shown in step d in FIG. 1. After the patterning, the resist film R is removed using an HF chemical solution such as buffered hydrogen fluoride (BHF).

5. Aluminum Wiring Film Formation

Next, as shown in step a in FIG. 2, an aluminum wiring film (AL layer) 40 is formed by sputtering. The aluminum wiring film 40 may also be formed by vacuum evaporation or CVD.

6. Channel Etching

Next, as shown in step b in FIG. 2, the aluminum wiring film 40 and the low-resistance layer 30 are etched using a patterned resist film R in order to form an electrode pattern, which is referred to as channel etching. With this arrangement, source/drain electrodes 30*s* and 30*d* are formed adjacent to the microcrystalline silicon film 20. After the patterning, the resist film R is removed using the BHF.

7. Underside Etching/Underside Aluminum Evaporation

Next, as shown in step c in FIG. 2, an aluminum (Al) layer 50 is deposited on the underside of the substrate G by evaporation.

8. Passivation Layer Formation/Annealing

Finally, as shown in step d in FIG. 2, an insulating film such as an SiN film is formed as a passivation layer 60 with plasma generated by CVD in order to protect the TFT stacked on the substrate G as described above. Hydrogen plasma processing may be executed while performing heat treatment on the passivation layer 60.

(Microwave Plasma CVD Device)

Figure 3:
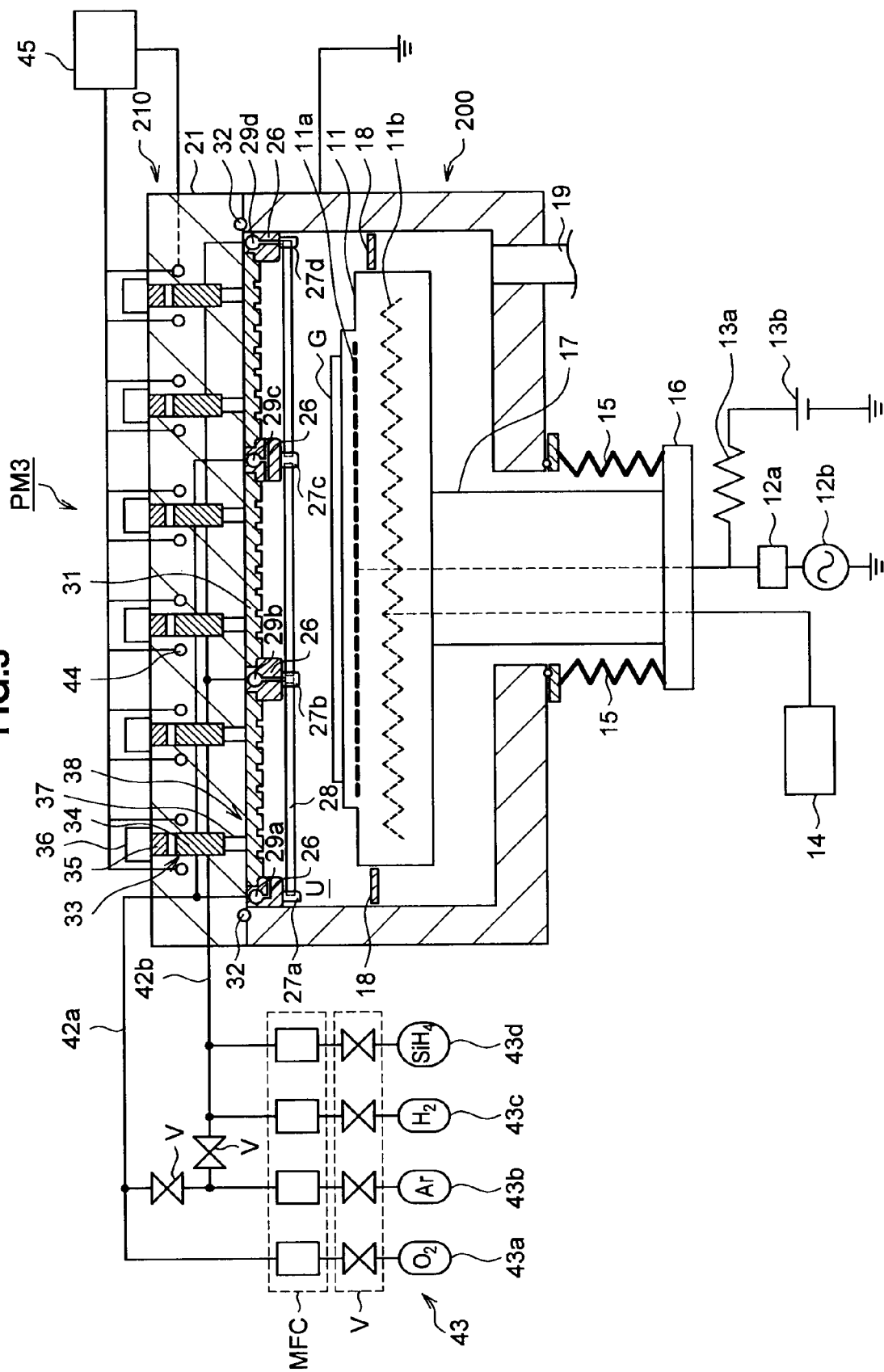
FIG. 3 is a vertical sectional view of a CMEP processing apparatus in the first and second embodiments.

Next, a microwave plasma processing apparatus (PM3) will be described with reference to FIG. 3. FIG. 3 schematically shows a vertical section of the microwave plasma processing apparatus PM3. The microwave plasma processing apparatus is an example of a manufacturing device that forms the stacked-layer film 20 of the microcrystalline silicon film and the ultra-microcrystalline silicon film.

The microwave plasma processing apparatus includes a processing container 200 and a lid 210. The processing container 200 assumes a rectangular parallelepiped shape with an open top and a solid-bottom. The processing container 200 and the lid 210 are sealed together via an O ring 32 disposed between the external circumference of the bottom surface of a lid main body 21 and the external circumference of the top surface of the processing container 200. A processing chamber U that executes plasma processing is thereby formed. The processing container 200 and the lid 210 may be made of a metal such as aluminum and are electrically grounded.

The processing container 200 includes in its inside a susceptor 11 (stage) for placing the substrate G thereon. The susceptor 11 is made of aluminum nitride, for example, and includes in its inside a power supply unit 11a and a heater 11b.

To the power supply unit 11a, a high-frequency power source 12b is connected via a matcher 12a (such as a capacitor). In addition, a high-voltage DC power source 13b is connected to the power supply unit 11a via a coil 13a. The matcher 12a, high-frequency power source 12b, coil 13a, and the high-voltage DC power source 13b are disposed outside the processing container 200. The high-frequency power source 12b and the high-voltage DC power source 13b are grounded.

The power supply unit 11a applies a predetermined level of bias voltage into the processing container 200 by using high-frequency power output from the high-frequency power source 12b. In addition, the power supply unit 11a electrostatically adsorbs the substrate G with a DC voltage output from the high-voltage DC power source 13b.

To the heater 11b, an AC power source 14 disposed outside the processing container 200 is connected. By using an AC voltage output from the AC power source 14, the heater 11b maintains the temperature of the substrate G at a predetermined level.

A cylindrical opening is formed at the bottom surface of the processing container 200. One end of a bellows 15 is attached to the circumferential edge of the opening on the bottom side of the processing container 200. The other end of the bellows 15 is fastened to an elevator plate 16. As described above, holes at the bottom surface of the processing container 200 are sealed by the bellows 15 and the elevator plate 16.

The susceptor 11 is supported by a cylindrical body 17 disposed on the elevator plate 16. The susceptor 11 moves up and down together with the elevator plate 16 and the cylindrical body 17. With this arrangement, the height of the susceptor 11 is adjusted to a position corresponding to a specific processing operation. Further, around the susceptor 11, a baffle plate 18 for controlling a gas flow in the processing chamber U to be an optimal state is disposed.

A vacuum pump (not shown) disposed outside the processing container 200 is provided near the bottom of the processing container 200. As the gas is exhausted with the vacuum pump from the processing container 200 via a gas exhaust pipe 19, the pressure inside the processing chamber U is lowered until a desired degree of vacuum is achieved.

At the lid 210, six rectangular waveguides 33, a slot antenna 38, and a dielectric member (constituted from a plurality of dielectric plates 31) are provided. Each of the six rectangular waveguides has a rectangular cross section. The six rectangular waveguides are disposed parallel to one another inside the lid main body 21. The space inside each rectangular waveguide 33 is filled with a dielectric material 34 such as a fluorine resin (e.g., Teflon™), alumina ($Al_2O_3$), or quartz. By the dielectric material 34, a guide wavelength $\lambda g_1$ within each rectangular waveguide 33 is controlled as indicated in expression of $\lambda g_1 = \lambda c/(\in_1)^{1/2}$, in which $\lambda c$ indicates the wavelength in free space, while $\in_1$ indicates the dielectric constant of the dielectric member 34.

Each rectangular waveguide 33 has an opening at an upper portion thereof, and a movable portion 35 is inserted into the opening of the rectangular waveguide 33 to be allowed to move up/down freely. The movable portion 35 may be formed of a nonmagnetic, electrically conductive material such as aluminum. Outside the lid main body 21, an elevator mechanism 36 is disposed at the upper surface of each movable portion 35 so as to move the movable portion 35 up/down. This structure allows the movable portion 35 to move to a point level with the upper surface of the dielectric material 34 so as to freely adjust the height of the rectangular waveguide 33.

The slot antenna 38, located on the bottom side of the lid main body 21, is formed as an integrated part of the lid main body 21. The slot antenna 38 may be formed of a nonmagnetic metal such as aluminum. A plurality of slots 37 of the slot antenna 38, which are openings, are formed in series at the bottom surface of each rectangular waveguide 33. The space inside each slot 37 is filled with a dielectric member formed of fluororesin, alumina ($Al_2O_3$), or quartz. The dielectric member enables control of a guide wavelength $\lambda g_2$ inside each slot 37, as indicated in an expression of $\lambda g_2 = \lambda c/(\in_2)^{1/2}$, in which $\lambda c$ indicates the wavelength in free space, while $\in_2$ indicates the dielectric constant of the dielectric member inside the slot 37.

Each dielectric plate 31 is respectively installed at portions of the undersurface of slots 37 formed at the bottom surfaces of the two adjacent rectangular waveguides 33. With this arrangement, the dielectric plates 31 each formed in the shape of a tile are installed on the entire ceiling surface of the processing container at equal intervals in an array form.

Each dielectric plate 31 is formed of a dielectric material such as glass quartz, AlN, $Al_2O_3$, sapphire, SiN, or ceramics. Recessed portions and projecting portions are formed at the surface of each dielectric plate 31 that faces opposite the substrate G. The presence of at least one of the recessed portions and the projecting portions formed at the surface of each dielectric plate 31 as described above increases the loss of electric field energy as the surface wave is propagated over the surface of each dielectric plate 31. Thus, the extent of surface wave propagation is suppressed. As a result, generation of a standing wave is inhibited, and uniform plasma may be thereby generated. Incidentally, the number of the slots 37 formed at the bottom surface of each rectangular waveguide 33 is arbitrary.

A latticed beam 26 is provided at the bottom surface of the slot antenna 38. Peripheral edges of each dielectric plate 31 are supported by the beam 26. The beam 26 projects toward the substrate at the peripheral edges of each dielectric plate 31. The beam 26 may be formed of a nonmagnetic, electrically conductive material such as aluminum.

At portions of the underside of the beam 26, supporting bodies 27 (composed of supporting bodies 27a to 27d) are provided. Both ends of each gas pipe 28, which is a unit constituting a gas shower head in a lower stage, for example, are supported by the supporting bodies 27. The gas pipe 28 is formed of a dielectric such as alumina.

To cooling water pipes 44, a cooling water supply source 45 arranged outside the microwave plasma processing apparatus is connected. Then, cooling water supplied from the cooling water supply source 45 is circulated through the cooling water pipes 44 and is then returned to the cooling water supply source 45. The lid main body 21 is thereby kept at a desired temperature.

With the arrangement described above, a microwave of 2.45 GHz×3, for example, output from a microwave generator not shown propagates through each rectangular waveguide 33, passes through each slot 37, passes through each dielectric plate 31, and is then supplied into the processing chamber U.

A gas supply source 43 is formed of a plurality of valves V, a plurality of mass flow controllers MFCs, an oxygen gas supply source 43a, an argon gas supply source 43b, a hydrogen gas supply source 43c, and a silane gas supply source 43d.

In the gas supply source 43, an open/closed state of each valve V and an opening degree of each mass flow controller MFC are respectively controlled, thereby supplying an oxygen gas, an argon gas, a hydrogen gas, and a silane gas of desired concentrations to the processing container 200.

Gas supply pipes 29 (composed of gas supply pipes 29a to 29d) penetrate the beam 26. The oxygen gas supply source 43a and the argon gas supply source 43b are connected to the gas supply pipes 29a and 29c via a first flow path 42a. The argon gas supply source 43b, hydrogen gas supply source 43c, and silane gas supply source 43d are connected to the gas supply pipes 29b and 29d via a second flow path 42b.

The oxygen gas and the argon gas are supplied into a space between each dielectric plate 31 and each gas pipe 28 through the gas supply pipes 29a and 29c. On the other hand, the argon gas, hydrogen gas, and silane gas are supplied toward the substrate G on the susceptor 11 through gas supply openings in the respective gas pipes 28 through the gas supply pipes 29b and 29d. Each gas supplied as described above is excited by the electric field energy of the microwave, thereby generating the plasma. Then, using the plasma thus generated, the microcrystalline silicon film and the ultra-microcrystalline silicon film are formed based on predetermined process conditions.

The microwave that has passed through each dielectric plate 31 propagates between the undersurface of each dielectric plate 31 and the plasma as the surface wave (traveling wave). When the surface wave has reached the beam 26, the surface wave reflects as a reflective wave. Normally, due to interference between the travelling wave and the reflected wave, the standing wave is generated. Since a microwave of 2.45 Hz has a wavelength of approximately 120 mm in free space, the wavelength of the standing wave becomes approximately 120 mm. On the other hand, in a cellular microwave excitation plasma (CMEP) processing apparatus, dimensions of the dielectric plate 31 are on the order of 120 mm×120 mm, each of which is at most equivalent to one wavelength of the standing wave. This means that substantially no standing wave is generated in the CMEP processing apparatus. The standing wave hinders stable generation of the uniform plasma. Thus, using the CMEP processing apparatus, by providing the dielectric plates 31 at predetermined intervals in the array form, the uniform plasma may be stably generated. As a result, using the plasma generated to be uniform below the entire ceiling surface of the processing container, the good-quality stacked-layer film 20 may be formed above the substrate having a large area.

The low-resistance layer 30 is formed by further supplying the hydrogen and silane gases while doping phosphor (P) in the process module PM3 after the microcrystalline silicon film 20 has been formed.

Next, the stacked-layer film 20 will be described in detail by comparing the single-layer film formed of the microcrystalline silicon film with the stacked-layer film 20 formed of the microcrystalline silicon film and the ultra-microcrystalline silicon film.

(Single-Layer Film)

Figure 4:
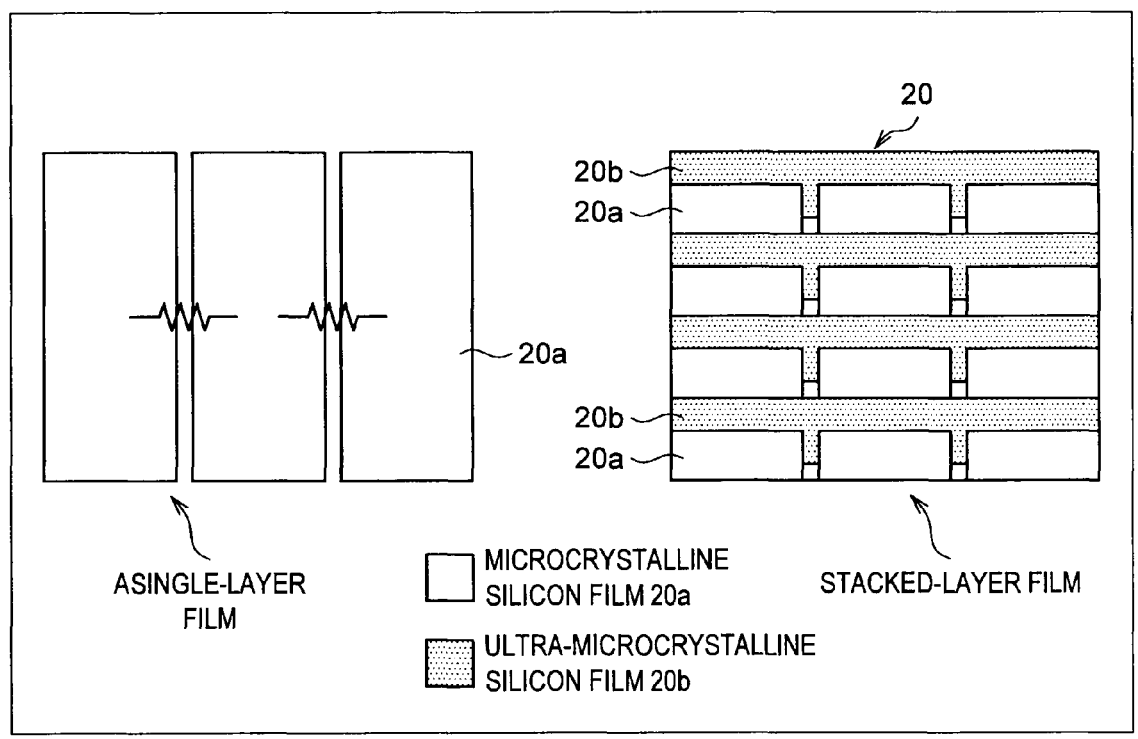
FIG. 4 is a diagram schematically showing a single-layer film and a stacked-layer film in the first and second embodiments.
Figure 14:
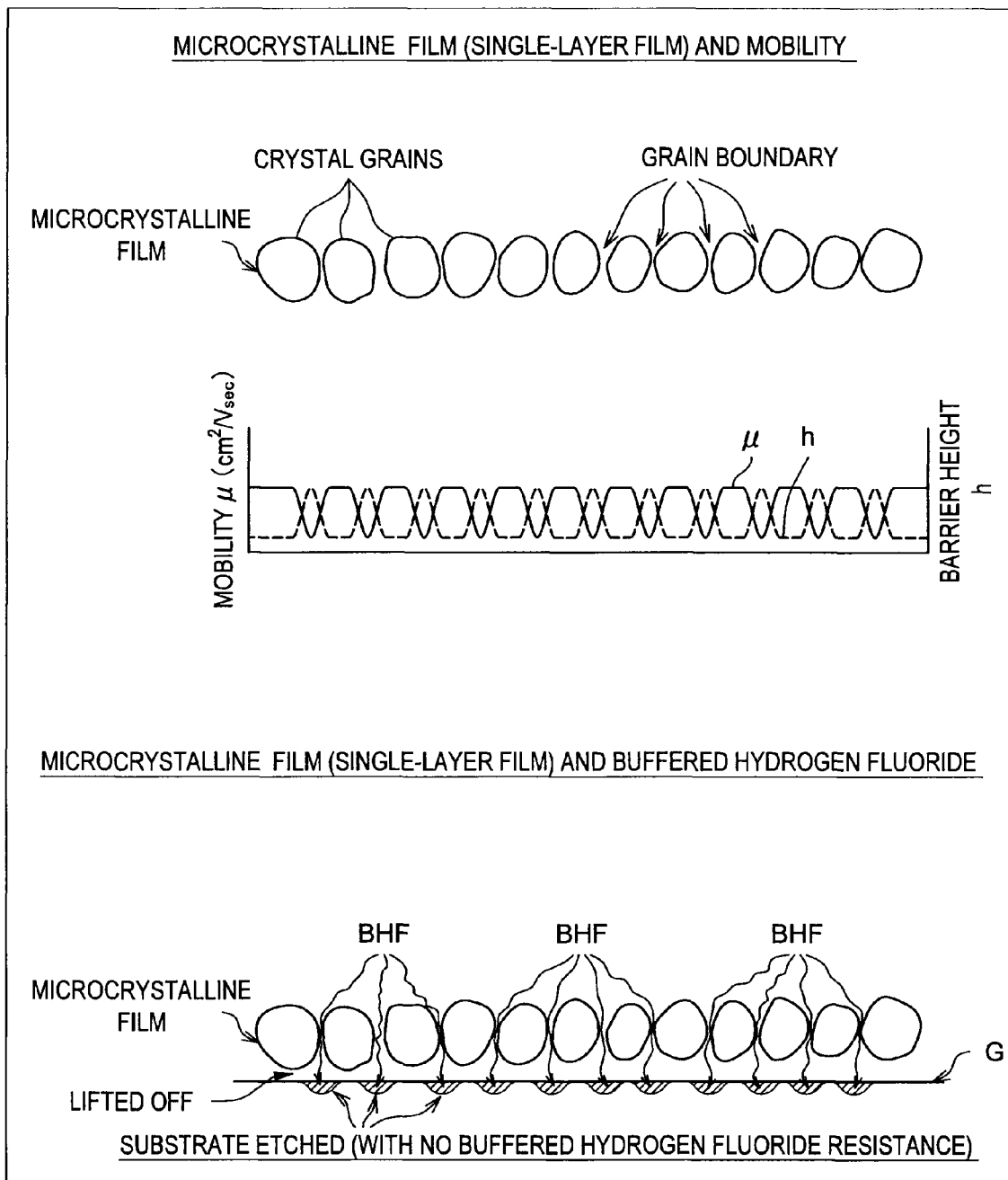
FIG. 14 includes diagrams for explaining a relationship between a single-layer film and its mobility and a relationship between the single-layer film and its BHF resistance.

FIG. 4 and FIG. 14 show states of the microcrystalline film, which is a single-layer film. Since crystal grains of the microcrystalline film grow in a columnar manner, bonding between the crystal grains is weak. Accordingly, as shown about the microcrystalline film (single-layer film) and mobility in an upper portion of FIG. 14, a barrier h is generated at a grain boundary between the crystal grains. When a carrier moves across the grain boundary of the microcrystalline film, this barrier h develops a large electrical resistance in a horizontal direction of the film. For this reason, the barrier h reduces a mobility $\mu$, delays an operation of the TFT, and also renders operation characteristics of a TFT using this microcrystalline film unstable.

Further, when the bonding between the crystal grains is weakened, the HF chemical solution such as the BHF used when a resist film is removed during manufacture of the TFT enters into a base of the microcrystalline film, after having passed through the grain boundaries as shown about the microcrystalline film (single-layer film) and the BHF in a lower portion of FIG. 14. In this case, the microcrystalline silicon film is not etched by the BHF. However, the substrate G, which is the base of the microcrystalline film, is etched. As a result, the microcrystalline silicon film may be lifted off from the substrate, and may finally come off from the substrate. The transistor may be thereby difficult to manufacture. As described above, the horizontal bonding between the crystal grains is weak in the single-layer film formed of the microcrystalline film alone. Thus, electrical and physical characteristics of the TFT deteriorate at the grain boundaries.

(Stacked-Layer Film)

Then, the inventor has contrived to employ the stacked-layer film 20 indicated in FIG. 4 in place of the single-layer film indicated in FIG. 4, as the active layer of the TFT according to this embodiment. Then, the inventor has conducted an experiment to find what change will be made in the operation of the TFT when the stacked-layer film 20 is employed.

(TFT Characteristic Evaluation)

The inventor used the microwave plasma processing apparatus shown in FIG. 3 in order to evaluate characteristics of the TFT. When the gate oxide film 10 was formed, microwave power was set to 2.25 kW, the pressure inside the processing container was set to 150 mTorr. Then, the oxygen gas with a flow rate of 625 sccm was supplied via the gas supply pipes 29a and 29c. Then, via the gas supply pipes 29b and 29d, the silane gas with a flow rate of 100 sccm and the hydrogen gas with a flow rate of 1500 sccm were supplied from the gas pipes 28 into locations of the processing chamber lower than locations of the processing chamber into which the oxygen gas has been supplied. Further, the position of the susceptor 11 was moved so that a gap between each dielectric plate 31 and the susceptor 11 was 166 mm. Under the process conditions described above, the gate oxide film 10 was deposited to a film thickness of 100 nm.

After the gate oxide film 10 was formed, open/closed states of desired valves V were controlled. The argon gas with a flow rate of 126 sccm was supplied into an upper space of the processing chamber U via the gas supply pipes 29a and 29c.

Then, the silane gas with a flow rate of 12 sccm and the hydrogen gas with a flow rate of 12 sccm were supplied from the gas pipes 28 into locations of the processing chamber lower than the location of the processing chamber into which the argon gas had been introduced. Then, the position of the susceptor 11 was moved so that the gap between the dielectric plate 31 and the susceptor 11 was 182 mm. Under the process conditions described above, two patterns of forming the single-layer film and forming the stacked-layer film were provided. In this case, both of the single-layer film and the stacked-layer film were deposited to a film thickness of 100 nm.

In this experiment, the microwave power was set to two patterns of low power and high power, and the experiment was conducted. Specifically, when the single-layer film was deposited with the low microwave power, the microwave power was set to 2 kW, and the pressure inside the processing chamber was set to 30 mTorr. When the single-layer film was deposited with the high microwave power, only the microwave power was changed to 5 kW, and the pressure inside the processing chamber remained unchanged at 30 mTorr.

When the stacked-layer film was deposited with the low microwave power, the microcrystalline film was deposited for 10 seconds with the microwave power set to 2 kW, and the pressure inside the processing chamber set to 30 mTorr. The microcrystalline film thus formed will be hereinafter referred to as a first film, and a step of forming the first film will be hereinafter referred to as a first step. Then, the microwave power and the pressure were respectively changed to 3 kW and 10 mTorr, and the ultra-microcrystalline film was deposited for 10 seconds. The ultra-microcrystalline film thus formed will be hereinafter referred to as a second film, and a step of forming the second film will be hereinafter referred to as a second step. This process is repeated to achieve the film thickness of the stacked-layer film of 100 nm. When the stacked-layer film was formed with the high microwave power, the microcrystalline film was deposited for 10 seconds with the microwave power set to 5 kW, and the pressure set to 30 mTorr. Then, the ultra-microcrystalline film was deposited for 10 seconds with the microwave power changed to 3 kW and the pressure changed to 10 mTorr. This process was repeated to achieve the film thickness of the stacked-layer film of 100 nm.

FIG. 5 shows evaluations on the characteristics of the TFTs obtained as a result of forming the single-layer films and the stacked-layer films as the active layers of the TFTs. In the case of the TFT operation characteristics when the single-layer film was formed with the high power of 5 kW, the mobility μ (in the saturated region) was 0.55, an on/off current ratio (in the saturated region) was 4.5. These values were better than the mobility μ of 0.010 and the on/off current ratio of 4.0 when the single-layer film was formed with the low power of 2 kW. In addition, while the single-layer film formed with the high microwave power was resistant to the BHF, the single-layer film formed with the low microwave power was not resistant to the BHF.

When a chemical solution such as the BHF did not enter a film or when the chemical solution did not reach the base of the film even if the chemical solution had entered the film, it was determined that the film was resistant to the BHF. When the chemical solution had reached the base of the film and the base of the film was etched, it was determined that the film was not resistant to the BHF. BHF resistance serves as an indicator showing denseness of a film. When the film is resistant to the BHF, it is determined that the film is dense. When the film is not resistant to the BHF, it is determined that the film is not dense.

On the other hand, the stacked-layer film formed with the high microwave power did not exhibit the operation characteristics as the TFT, though the stacked-layer film was resistant to the BHF. The stacked-layer film formed with the low microwave power was resistant to the BHF, and the mobility and the on/off current ratio of the stacked-layer film were respectively 0.65 and 4.5, which were the most satisfactory values.

As a result, it was found that the stacked-layer film deposited with the low microwave power was a good-quality film that had the better TFT operation characteristics than the single-layer film, and was also resistant to the BHF. In order to consider the reason why electrical and physical characteristics of the stacked-layer film were better than those of the single-layer film, the inventor examined properties of the first and second films of the stacked-layer film formed with the low microwave power.

When examining the properties of the first and second films, the inventor derived a relative relationship between a plasma state and film properties as shown in FIG. 6. According to this relationship, when the electron density $N_e$ of plasma increases, film crystallinity increases, and film denseness also increases. When the electron temperature $T_e$ of the plasma increases, the film denseness increases though the film crystallinity is not influenced. Further, when hydrogen radicals in the plasma increase, the film crystallinity increases though the film denseness is not affected.

In order to increase the electron density $N_e$ of the plasma, the power of the microwave should be increased. In order to increase the electron temperature $T_e$ of the plasma, the pressure inside the processing chamber should be increased. Then, in order to increase the hydrogen radicals in the plasma, the power of the microwave should be increased.

When the power of the microwave is increased at a time of deposition of the microcrystalline film, ionization and dissociation of the various gases are promoted. Then, the electron density $N_e$ of the plasma is increased, and the silane gas is dissociated into $SiH_3$, $SiH_2$, hydrogen radicals, and the like. Si—Si bonding is thereby promoted, so that crystallization progresses.

On the other hand, when the power of the microwave is reduced, dissociation of the silane gas is not promoted. The silane gas thereby remains in the processing chamber. Then, the remaining silane gas reacts with the hydrogen radicals in the plasma, so that $SiH_3$ and $H_2$ are generated due to reduction action of hydrogen. When the power of the microwave is low at a time of crystallization of the microcrystalline film that is promoted using the hydrogen radicals as a catalyst, the hydrogen radicals that promote the crystallization are consumed for the reduction action. Thus, the crystallization of the microcrystalline film does not progress. In other words, in order to achieve crystallization with low microwave power, it is necessary to add hydrogen. However, the microcrystalline film that has better quality than with high-density plasma cannot be deposited.

A degree of crystallinity may be evaluated, based on a volume ratio of crystals to the entire film. In this embodiment, a crystal volume fraction is employed as an indicator showing crystallinity. The crystal volume fraction is obtained by the Raman scattering spectrum of microcrystalline silicon shown in FIG. 8. According to the document of "plasma semiconductor process engineering—Introduction to Deposition and Etching" by Toshiaki Sasaki and Shinriki Teii, first published by Uchida Roukakuho Publishing Co., Ltd on Jul. 25, 2003, the microcrystalline silicon has a TO mode peak including a sharp peak in the vicinity of 520 cm$^{-1}$ caused by a crystal silicon component and a broad peak in the vicinity of 480

$cm^{-1}$ caused by an amorphous silicon component. As an indicator effectively showing a magnitude of the crystal volume fraction, a Raman peak intensity ratio $I_{520}/I_{480}$ between the intensity of the peak in the vicinity of 480 $cm^{-1}$ and the intensity of the peak in the vicinity of 520 $cm^{-1}$ is employed.

There are proposed some methods of representing the absolute value of the crystal volume fraction. As an example of those methods, there is a method of calculating two Gaussian functions from peak wave numbers in the vicinity of 520 $cm^{-1}$ and 480 $cm^{-1}$ of Raman Shift indicated in FIG. 8, and setting an area intensity ratio $(A_{520}/(A_{520}+A_{480}))$ obtained by an area intensity $(A_{520})$ of the peak in the vicinity of 520 $cm^{-1}$ and an area intensity $(A_{480})$ of the peak in the vicinity of 480 $cm^{-1}$ to the crystal volume fraction (vol. %).

Alternatively, another method may be pointed out. In this method, there is a method of calculating three Gaussian functions from peak wave numbers in the vicinity of 520 $cm^{-1}$, 510 $cm^{-1}$, and 480 $cm^{-1}$ of Raman Shift indicated in FIG. 8, and an area intensity ratio $(A_{520}+A_{510}/(A_{520}+A_{510}+A_{480}))$ obtained by the area intensity $(A_{520})$ of the peak in the vicinity of 520 $cm^{-1}$, an area intensity $(A_{510})$ of a peak in the vicinity of 510 $cm^{-1}$, and the area intensity $(A_{480})$ of the peak in the vicinity of 480 $cm^{-1}$ is set to the crystal volume fraction (vol. %). The peak in the vicinity of 510 $cm^{-1}$ is assumed to be caused by a crystal component having a fine crystal grain diameter. It is pointed out, however, that in these methods, correlation is difficult to obtain in the case of the film with a high crystallinity.

Accordingly, in this specification, the intensity ratio $I_{520}/I_{480}$ will be employed as the indicator showing the magnitude of the crystal volume fraction.

Figure 8:
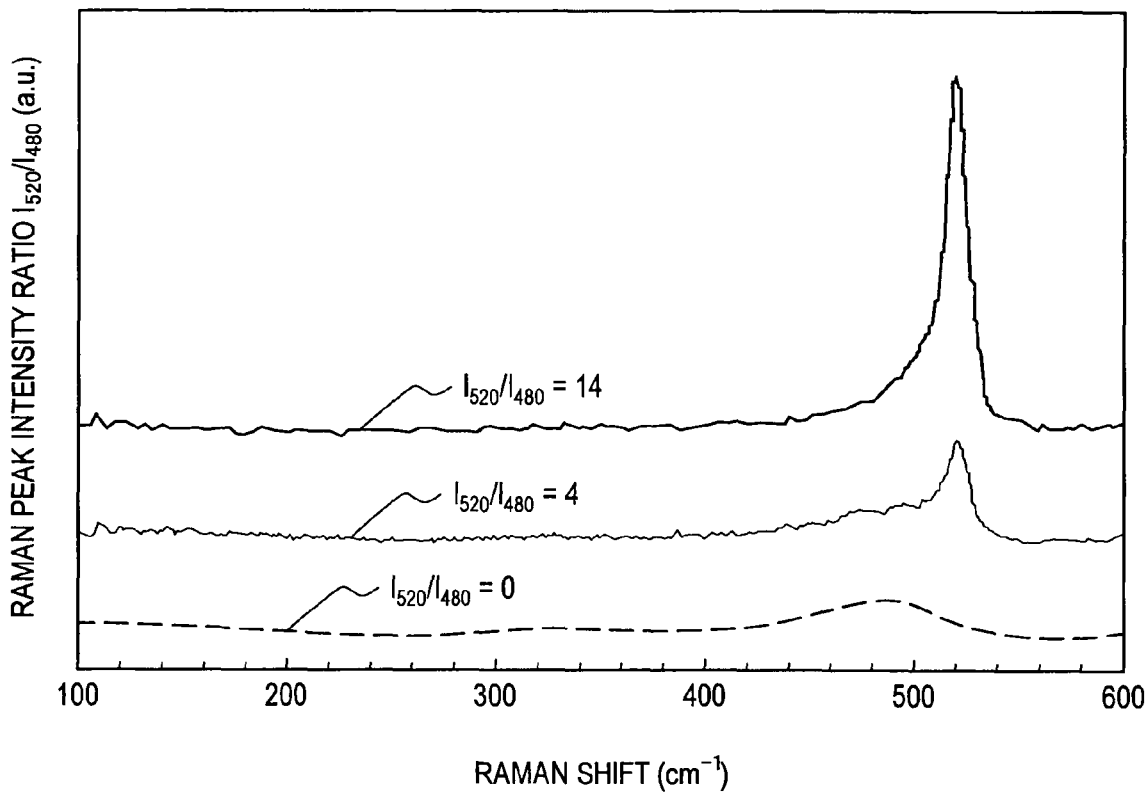
FIG. 8 is a graph for explaining a relationship between a Raman peak intensity ratio and crystallinity of each film.

As shown in FIG. 8, the larger the intensity ratio $I_{520}/I_{480}$ becomes, the higher crystallinity becomes. Then, the smaller the intensity ratio $I_{520}/I_{480}$ becomes, the lower crystallinity becomes.

In this embodiment, whether the base of the film is etched by the chemical solution such as the BHF or not is set as an indicator showing denseness of the film. When the chemical solution such as the BHF does not enter into the film or when the chemical solution does not reach the base of the film even though the chemical solution has entered into the film, it is determined that the film is dense. When the chemical solution reaches the base of the film and then the base of the film is etched, it is determined that the film is not dense. When the film has the BFH resistance, the film is dense. When the film does not have the BFH resistance, the film is not dense.

By stacking the microcrystalline and ultra-microcrystalline films as shown in FIG. 4, the dense ultra-microcrystalline silicon film 20b may bridge between crystal grains of the microcrystalline silicon films 20a. This structure is different from that of the single-layer film indicated in FIG. 4.

Figure 7:
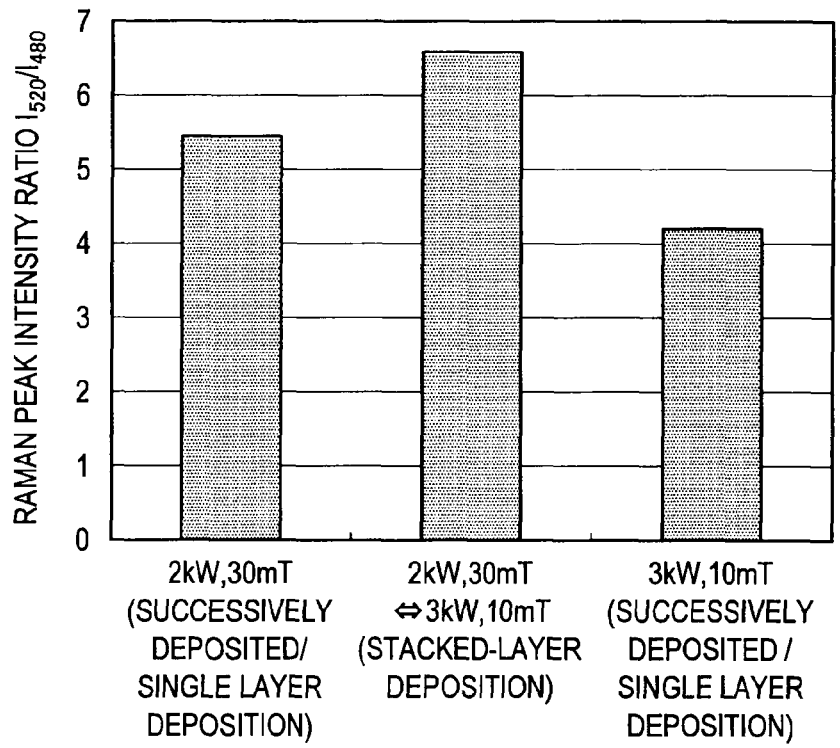
FIG. 7 is a graph showing Raman peak intensity ratios of each single-layer film and the stacked-layer film shown in FIG. 4.

Referring to FIG. 7 which shows the Raman peak intensity ratio of each film, the intensity ratio $I_{520}/I_{480}$ of the stacked-layer film 20 shown in FIG. 4 was higher than the intensity ratio $I_{520}/I_{480}$ of the microcrystalline silicon films 20a of the single-layer films shown in FIG. 4 successively deposited under the process conditions of the microwave power of 2 kW and the pressure of 30 mTorr and the intensity ratio $I_{520}/I_{480}$ of the ultra-microcrystalline silicon films 20b of single-layer films successively deposited under the process conditions of the microwave power of 3 kW and the pressure of 10 mTorr. It could also be clarified that the single-layer film formed of the ultra-microcrystalline silicon film 20b alone had a lower crystallinity than the single-layer film formed of the microcrystalline silicon film 20a alone.

Based on this result, the inventor has considered the following. Since the ultra-microcrystalline film 20b has high denseness, the ultra-microcrystalline film 20b bridges between the crystal grains of the microcrystalline silicon film 20a. In addition, as shown in FIG. 4 since the crystal grain diameter of the ultra-microcrystalline film 20b is smaller than the crystal grain diameter of the microcrystalline film 20a, the ultra-microcrystalline film 20b enters into respective gaps between the crystal grains of the microcrystalline film 20a, thereby filling grain boundaries between the crystal grains of the microcrystalline film 20a. Thus, the inventor has considered that the stacked-layer film has a higher crystallinity than the single-layer film. Consideration of the inventor that the crystal grain diameter of the ultra-microcrystalline film 20b is smaller than the crystal grain diameter of the microcrystalline film 20a is estimated from the above-mentioned "plasma semiconductor process engineering" as well. In this document, it is described that a peak in the vicinity of 510 $cm^{-1}$ between the peak in the vicinity of 520 $cm^{-1}$ caused by the crystal silicon component and the peak in the vicinity of 480 $cm^{-1}$ caused by the amorphous silicon component is assumed to be caused by a crystal component having a fine grain diameter.

Based on the consideration described above, the inventor has concluded as follows:
(1) The ultra-microcrystalline silicon film 20b is denser than the microcrystalline silicon film 20a.
(2) Since the ultra-microcrystalline silicon film 20b has crystallinity, the ultra-microcrystalline silicon film 20b is different from the amorphous silicon film that has no crystallinity. However, the ultra-microcrystalline silicon film 20b does not have so much crystallinity as the microcrystalline silicon film 20a.
(3) The ultra-microcrystalline silicon film 20b includes crystal grains finer than those included in the microcrystalline silicon film 20a.

Figure 9:
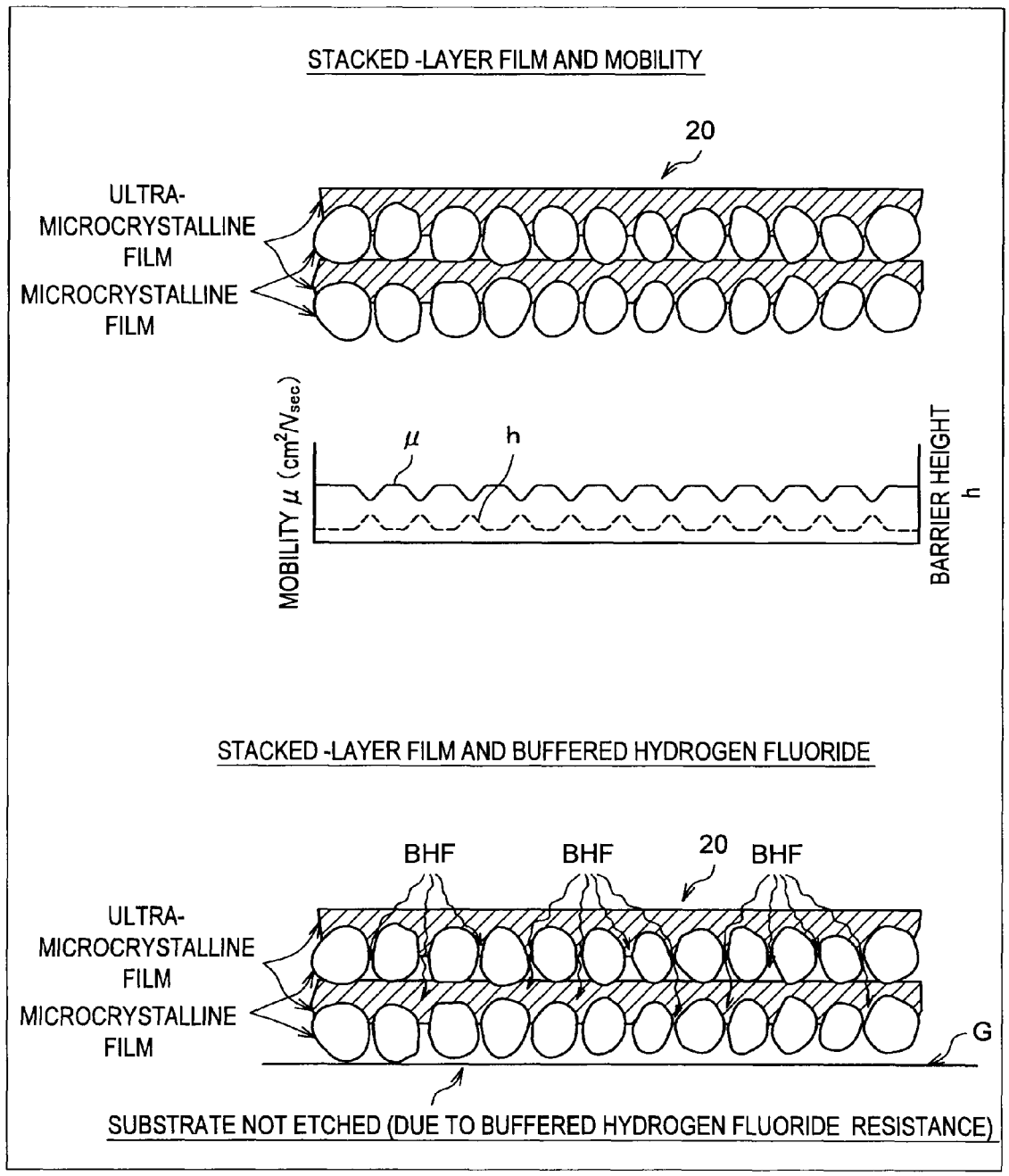
FIG. 9 includes diagrams for explaining a relationship between the stacked-layer film and its mobility and a relationship between the stacked-layer film and its BHF resistance in the first and second embodiments.

Then, the inventor could reduce the height of the barriers h in the vicinity of the grain boundaries, as shown in an upper portion of FIG. 9, by using the stacked-layer film 20 that has strong horizontal bonding between crystal grains, formed by stacking the ultra-microcrystalline silicon film 20b having the three features as described above on the microcrystalline silicon film 20a. As a result, the TFT of which mobility is enhanced, operating speed is faster, and operation is stable could be manufactured.

Further, as shown in a lower portion of FIG. 9, the BHF resistance was improved due to the ultra-microcrystalline silicon film wholly or partially embedded into the grain boundaries of the microcrystalline silicon film. As a result, the TFT could be stably manufactured, with the stacked-layer film not lifted off during the manufacture.

As described above, according to the film formation method in this embodiment, the TFT of which the mobility μ and the on/off current ratio are kept high and which may perform high-speed processing with low power consumption may be manufactured.

The predetermined electron temperature of the plasma used when the microcrystalline film is formed may be set to 4.5 eV or less. With this setting, the ultra-microcrystalline film may be formed by an inductively coupled plasma (ICP) processing apparatus or a helicon wave plasma processing apparatus in which the electron temperature of plasma may be 4.5 eV or less. More preferably, the predetermined electron temperature may be set to 2 eV or less. When the predetermined electron temperature is set as described above, a microwave plasma processing apparatus in which the electron temperature of generated plasma is 2 eV or less or plasma generated by electron cyclotron resonance (ECR) may be used to allow prevention of excessive dissociation of the process gases and reduction of energy of ions to be radiated onto the substrate. A good-quality ultra-microcrystalline film may be thereby formed.

The electron density $N_e$ of the high electron density plasma may be $5 \times 10^{10}$ cm$^{-3}$ or higher. Preferably, the high electron density plasma with the electron density $N_e$ of $10^{11}$ cm$^{-3}$ or higher may be used. The high electron density plasma may be generated using the microwave, inductively coupled plasma (ICP), and helicon wave plasma processing apparatuses.

In the second step in the first embodiment, the pressure inside the processing container was set to be lower than that in the processing container in the first step. By reducing the pressure in the processing container in the second step as described above, the electron temperature $T_e$ of the plasma is raised. The ultra-microcrystalline film that is denser than the microcrystalline film formed in the first step may be thereby formed in the second step, as shown in FIG. 6.

Further, in the first step, the microcrystalline silicon film may be formed by plasma having a higher electron density than in the second step.

Alternatively, in the first step, the microcrystalline silicon film may be formed by electron density plasma using a larger amount of hydrogen radicals that are present within the processing container than in the second step.

In the first step, the energy to be supplied into the processing container may be set to be higher than the energy to be supplied in the second step.

By raising the microwave power in the first step as described above, crystallinity of the microcrystalline film formed in the first step may be increased, as shown in FIG. 6.

Second Embodiment

In the first embodiment, depositing the stacked-layer film of the microcrystalline silicon film and the ultra-microcrystalline silicon film as the active layer, the TFT with the high mobility μ and the high on/off current ratio and strong BHF resistance could be manufactured. Based on this result, the inventor has considered whether there is an optimal film thickness combination between the microcrystalline silicon film and the ultra-microcrystalline silicon film. Then, in a second embodiment, an experiment and a result of the experiment conducted by the inventor in order to obtain a proper film thickness combination between the microcrystalline silicon film and the ultra-microcrystalline silicon film will be described.

The inventor changed a deposition time of each film in order to change a film thickness combination between the two types of films. Specifically, the deposition time of the microcrystalline film (first film) was changed to 5 seconds, 10 seconds, and 15 seconds, and the deposition time of the ultra-microcrystalline film (second film) was changed to five seconds and 10 seconds. The inventor thus formed six types of stacked-layer films by changing a combination of (the deposition time of the microcrystalline film and the deposition time of the ultra-microcrystalline film) to six possible combinations of (5 seconds, 5 seconds), (5 seconds, 10 seconds), (10 seconds, 5 seconds), (10 seconds, 10 seconds), (15 seconds, 5 seconds), and (15 seconds, 10 seconds). Process conditions of the microcrystalline film and the ultra-microcrystalline film are the same as those in the first embodiment.

Figure 11:
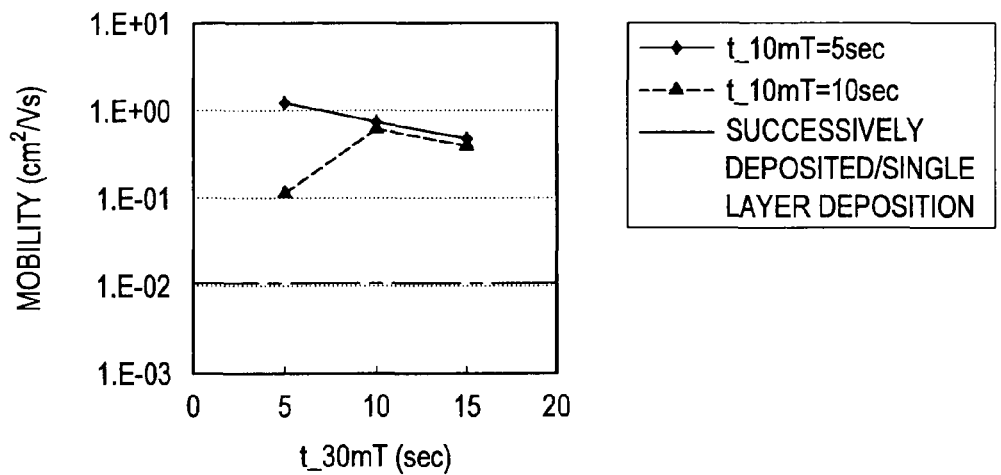
FIG. 11 is a graph showing mobilities of the stacked-layer films in the second embodiment.
Figure 12:
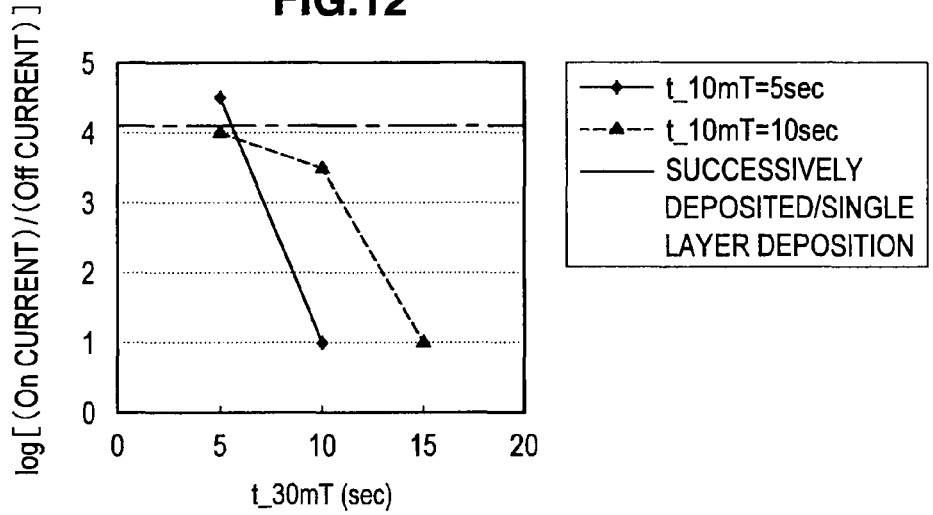
FIG. 12 is a graph showing on/off current ratios of the stacked-layer films in the second embodiment.
Figure 13:
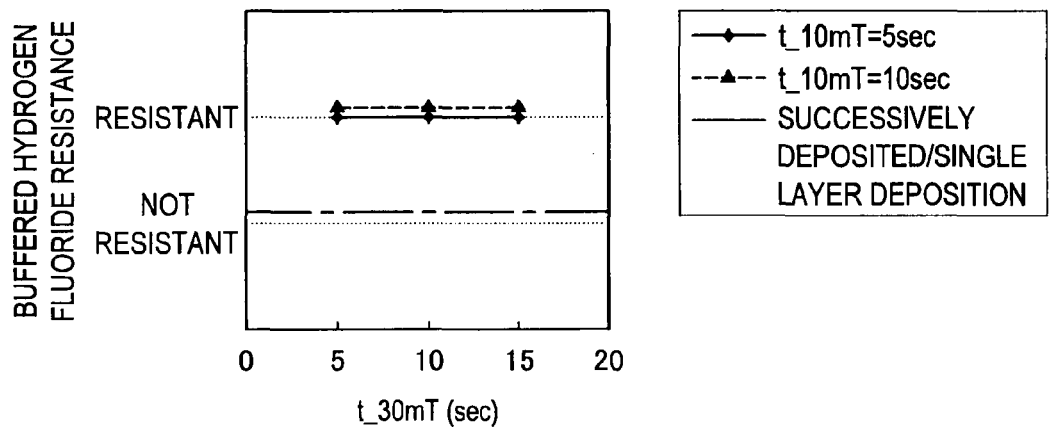
FIG. 13 is a graph showing BHF resistances of the stacked-layer films in the second embodiment.

Results obtained by changing the deposition time of each film are shown in FIGS. 10 to 13. FIG. 11 is the plot of the mobility μ selected from the obtained results in FIG. 10 and shows comparison with the microcrystalline silicon films successively deposited under the process conditions of the microwave power of 2 kW and the pressure of 30 mTorr. FIG. 12 is the plot of the log (on/off current ratio) selected from the obtained results in FIG. 10 and shows comparison with the microcrystalline silicon films successively deposited under the process conditions of the microwave power of 2 kW and the pressure of 30 mTorr. FIG. 13 shows the BHF resistance (not shown in FIG. 10).

Based on these results, the inventor has found that operation characteristics of the transistor change when the deposition time of each layer is changed. Specifically, when the combination of the deposition times of the microcrystalline silicon film and the ultra-microcrystalline silicon film was set to the shortest times of (5 seconds, 5 seconds), the mobility μ assumed 1.20 (cm$^2$/Vsec) and the on/off current ratio assumed 4.5, which indicate the highest operation characteristics of the TFT.

This result shows that it is particularly preferable that each of the microcrystalline silicon film and the ultra-microcrystalline silicon film is stacked on the substrate so that each of the microcrystalline silicon film and the ultra-microcrystalline silicon film has a film thickness necessary for functioning as the TFT and the film thickness of each of the microcrystalline and ultra-microcrystalline silicon films is the thinnest. It was also found that all of the stacked-layer films had the BHF resistance.

As described above, according to the film formation method in this embodiment, the TFT of which the mobility μ and the on/off current ratio are kept high and which can perform high-speed processing with low power consumption may be manufactured.

Further, by using the microcrystalline silicon film as a channel layer, the need for an annealing process is eliminated. Then, by maintaining a process temperature at 600° C. or less, the TFT may be formed on an inexpensive glass substrate as well.

The film formation method in this embodiment includes a semiconductor film formation method used when the TFT is formed on a silicon wafer and a semiconductor film formation method used when the TFT is formed on a flat panel display (FPD).

In the embodiments described above, operations of the respective units are associated with one another and may be replaced with a sequence of operations, with the mutual association being taken into consideration. Each of the embodiments of a method of manufacturing a TFT of the present invention may be thereby regarded as an embodiment of a manufacturing device that manufactures the TFT using the film formation method of the present invention.

In the embodiments described above, the stacked-layer film was formed with plasma generated by CVD, using the CMEP processing apparatus. However, a radial line slot antenna (RLSA) plasma processing apparatus may also be employed for formation of the stacked-layer film.

The ultra-microcrystalline film may be formed by the inductively coupled plasma (ICP) processing apparatus or the helicon wave plasma processing apparatus as well, in which the electron temperature of plasma is 4.5 eV or less. It is noted, however, that a better-quality ultra-microcrystalline film may be formed by the microwave plasma processing apparatus in which the electron temperature of plasma is 2.0 eV or less.

Further, by incorporating the TFT manufactured by the manufacturing device described above into a display device, the display device capable of performing high-speed processing with low power consumption may be manufactured. As the display device, an organic electroluminescenece (EL) display, a plasma display, or a liquid crystal display (LCD) may be pointed out.

The electron density $N_e$ of the high electron density plasma used when the microcrystalline silicon film and the ultra-microcrystalline silicon film are formed should be $5 \times 10^{10}$ cm$^{-3}$ or higher. Preferably, the electron density $N_e$ of the high electron density plasma should be $10^{11}$ cm$^{-3}$ or higher. The above range of the electron density $N_e$ of plasma may be generated using the microwave, ICP, or helicon wave plasma processing apparatus.

A target object to which the above-mentioned process applied by the manufacturing device is not limited to the silicon substrate, and may also be a glass substrate.

Configurations, operations, and effects of these embodiments will be briefly summarized below. According to an embodiment of the present invention, there is provided a method of forming a film used for at least one of an n-channel TFT, a p-channel TFT and a solar battery. The film formation method may include:

a first step of forming a microcrystalline silicon film by high electron density plasma of a predetermined electron temperature or less; and a second step of forming an ultra-microcrystalline silicon film using high electron density plasma of an electron temperature higher than the predetermined electron temperature.

As described above, since the crystal grains of the microcrystalline film of the single layer grow in the columnar manner, the horizontal bonding between the crystal grains is weak. Accordingly, the base of the microcrystalline film may be etched by the chemical solution that has entered from the grain boundaries into the base through the microcrystalline film. Then, the microcrystalline film may be lifted off. Manufacture of the transistor may be thereby rendered difficult, or the operation characteristics such as the mobility or an on/off current ratio of the manufactured transistor may deteriorate in the vicinity of the grain boundaries.

On contrast therewith, according to the configuration of the above embodiments, the high electron density plasma of the predetermined electron temperature or less is employed for formation of the microcrystalline silicon film. Then, for formation of the ultra-microcrystalline silicon film deposited on the microcrystalline silicon film, the high electron density plasma of the higher electron temperature than the microcrystalline silicon film is employed.

According to relative relationships in FIG. 6 shown by the inventor, when an electron temperature $T_e$ of the high electron density plasma rises, a denser ultra-microcrystalline film is formed. This may be because, when the electron temperature $T_e$ rises, energy of ions to be radiated onto a substrate increases, and deposition of a three-dimensional structure of the film is suppressed to a certain degree. Accordingly, the ultra-microcrystalline film on the microcrystalline film is formed to be denser than the microcrystalline film. Process conditions of each step may be set so that the ultra-microcrystalline film deposited in the second step is formed to be denser than the microcrystalline film formed in the first step, as described above.

Alternatively, process conditions of each step may be set so that crystal grains of the ultra-microcrystalline film formed in the second step are smaller than those of the microcrystalline film formed in the first step.

Alternatively, process conditions of each step may be set so that the microcrystalline film formed in the first step has a higher crystal volume fraction than the ultra-microcrystalline film formed in the second step.

With these arrangements, a stacked-layer film may be deposited in which the microcrystalline film having a high crystallinity and the ultra-microcrystalline film having high denseness and/or smaller crystal grains are stacked.

In a stacked-layer film 20 in FIG. 4, the microcrystalline and ultra-microcrystalline films are stacked. The stacked-layer film 20 is thereby brought into a state where a dense ultra-microcrystalline silicon film 20b bridges between crystal grains of a microcrystalline silicon film 20a. This structure is different from that of a single-layer film shown in FIG. 4.

Next, referring to FIG. 7 which shows the Raman peak intensity ratio of each film, the intensity ratio $I_{520}/I_{480}$ of the stacked-layer film 20 in FIG. 4 was higher than the intensity ratio $I_{520}/I_{480}$ of the microcrystalline silicon film 20a of single-layer film in FIG. 4 successively deposited under the process conditions of a microwave power of 2 kW and a pressure of 30 mTorr and the intensity ratio $I_{520}/I_{480}$ of the ultra-microcrystalline silicon film 20b of single-layer film successively deposited under the process conditions of the microwave power of 3 kW and the pressure of 10 mTorr.

Based on this result, the inventor has considered the following. Since the ultra-microcrystalline film 20b of the stacked-layer film 20 has high denseness, the ultra-microcrystalline film 20b bridges between the crystal grains of the microcrystalline silicon film 20a. In addition, since the crystal grain diameter of the ultra-microcrystalline film 20b is smaller than the crystal grain diameter of the microcrystalline film 20a, the ultra-microcrystalline film 20b enters into respective gaps between the crystal grains of the microcrystalline film 20a, thereby filling grain boundaries between the crystal grains of the microcrystalline film 20a. Thus, the inventor has considered that the stacked-layer film has a higher crystallinity than the single-layer film. An idea of the inventor that the crystal grain diameter of the ultra-microcrystalline film 20b is finer than the crystal grain diameter of the microcrystalline film 20a is estimated from the above-mentioned "plasma semiconductor process engineering" as well. In this document, it is described that the peak in the vicinity of 510 cm$^{-1}$ between the peak in the vicinity of 520 cm$^{-1}$ caused by the crystal silicon component and the peak in the vicinity of 480 cm$^{-1}$ caused by the amorphous silicon component is assumed to be caused by the crystal component having the fine grain diameter.

Based on the consideration described above, the inventor has concluded as follows:

(1) The ultra-microcrystalline silicon film 20b is denser than the microcrystalline silicon film 20a.

(2) Since the ultra-microcrystalline silicon film 20b has crystallinity, the ultra-microcrystalline silicon film 20b is different from the amorphous silicon film that has no crystallinity. However, the ultra-microcrystalline silicon film 20b does not have so much crystallinity as the microcrystalline silicon film 20a.

(3) The ultra-microcrystalline silicon film 20b includes crystal grains finer than those included in the microcrystalline silicon film 20a.

Then, by stacking the ultra-microcrystalline silicon film 20b having the three features as described above on the microcrystalline silicon film 20a, the inventor has succeeded in not only causing the ultra-microcrystalline silicon film 20b to bridge the gaps between the crystal grains of the microcrystalline silicon film 20a but also wholly or partially filling the gaps between the crystal grains of the microcrystalline silicon film 20a with the ultra-microcrystalline silicon film 20b.

As a result, the inventor could reduce the height of barriers h in the vicinity of the grain boundaries, as shown in an upper portion of FIG. 9, by using the stacked-layer film 20 that has strong horizontal bonding between the crystal grains. Consequently, the TFT of which a mobility μ is enhanced, operating speed is faster, and operation is stable could be manufactured.

Further, as shown in a lower portion of FIG. 9, the inventor could prevent the HF chemical solution from passing through the grain boundaries, and reaching the base to cause the base to be etched at a time of manufacturing the TFT, using the stacked-layer film 20 that has the strong horizontal bonding between the crystal grains. Consequently, the TFT could be stably manufactured with the stacked-layer film 20 not lifted off during the manufacture.

The predetermined electron temperature may be set to 4.5 eV or less. With this setting, the stacked-layer film may be formed by an inductively coupled plasma (ICP) processing apparatus or a helicon wave plasma processing apparatus in which the electron temperature of plasma is 4.5 eV or less.

More preferably, the predetermined electron temperature is set to 2 eV or less. When the predetermined electron temperature is set as described above, a microwave plasma processing apparatus in which the electron temperature of plasma is 2 eV or less may be used to allow prevention of excessive dissociation of process gases. A good-quality stacked-layer film may be thereby deposited. Alternatively, plasma generated by electron cyclotron resonance (ECR) may be used.

An electron density $N_e$ of the plasma used when the microcrystalline silicon film and the ultra-microcrystalline silicon film are formed should be $5 \times 10^{10}$ cm$^{-3}$ or higher. More preferably, the high electron density plasma with the electron density of $10^{11}$ cm$^{-3}$ or higher is used. The high electron density plasma as described above may be generated using the microwave, ICP, and helicon wave plasma processing apparatus.

In particular, preferably, the microwave plasma processing apparatus may be a cellular microwave excitation plasma (CMEP) shown in FIG. 3.

In the CMEP processing apparatus, dielectric plates 31 shaped into tiles are provided in an array form. Each dielectric plate 31 is supported by a latticed beam 26, and is fixed to the ceiling surface of the processing container. The beam 26 is formed of a nonmagnetic, electrically conductive member.

A microwave that has passed through each dielectric plate 31 propagates between the undersurface of each dielectric plate 31 and the plasma as a surface wave (traveling wave). When the surface wave has reached the beam 26, the surface wave reflects as a reflective wave. Normally, due to interference between the travelling wave and the reflected wave, a standing wave is generated. A microwave of 2.45 Hz has a wavelength of approximately 120 mm in free space. On the other hand, dimensions of the dielectric plate 31 are on the order of 120 mm×120 mm, each of which is at most equivalent to one wavelength of the standing wave. This means that substantially no standing wave is generated in the CMEP processing apparatus. The standing wave hinders stable generation of uniform plasma. Thus, by providing the dielectric plates 31 at predetermined intervals in the array form and exciting the processing gases by the microwave that has passed through each dielectric plate 31 and has been supplied into the processing container in the CMEP processing apparatus, the plasma may be stably and uniformly generated. As a result, using the uniform plasma, plasma processing may be applied to a target object having a large area, with good accuracy.

On contrast therewith, in a capacitive coupling plasma having an electron temperature of 10 eV or more and an electron density of the order of $5 \times 10^9$ cm$^{-3}$ to $5 \times 10^{10}$ cm$^{-3}$, high-energy ions are irradiated onto the substrate during growth of crystals. Thus, crystallinity is difficult to be increased. Accordingly, it is not desirable to use the capacitive coupling plasma processing apparatus for deposition of the microcrystalline silicon film and the ultra-microcrystalline silicon film.

The first and second steps may be executed in the same processing container. A pressure inside the processing container in the second step may be set to be lower than a pressure inside the processing container in the first step. As shown in FIG. 6, by reducing the pressure inside the processing container in the second step, the electron temperature $T_e$ of the plasma may be increased. As a result, in the second step, the ultra-microcrystalline film that is denser than the microcrystalline film formed in the first step may be formed.

In the first step, the microcrystalline silicon film may be formed by the high electron density plasma having a higher electron density than in the second step.

In the first step, the microcrystalline silicon film may be formed by the high electron density plasma with a larger amount of hydrogen radicals than in the second step.

Power to be supplied into the processing container in the first step may be set to be higher than power to be supplied into the processing container in the second step.

As shown in FIG. 6, in the first step, by increasing the power of the microwave, the plasma with the higher electron density $N_e$ and a higher content of the hydrogen radicals may be generated. With this arrangement, the microcrystalline film with a higher crystallinity than in the ultra-microcrystalline film formed in the second step may be formed.

In the first step, the inventor changed a deposition time to 5 seconds, 10 seconds, and 15 seconds under the deposition condition of the microwave power of 2 kW and the pressure of 30 mTorr. Then, in the second step, the inventor repeated changing a deposition time to 5 seconds and 10 seconds under the deposition condition of the microwave power of 3 kW and the pressure of 10 mTorr, thereby forming the stacked-layer film 20. Characteristics of the stacked-layer film 20 obtained by changing the deposition time of each film, which are the mobility μ and an on/off current ratio, are shown in FIG. 10. According to FIG. 10, the operation characteristics of the TFT were the most satisfactory when the deposition times of the microcrystalline silicon film formed in the first step and the ultra-microcrystalline silicon film formed in the second step were respectively the shortest of 5 seconds.

Based on this result, the inventor has concluded that it is preferable that each of the microcrystalline silicon film and the ultra-microcrystalline silicon film be stacked on the target object so that the film thickness of each of the microcrystalline and ultra-microcrystalline silicon film is the thinnest, on the precondition that each of the microcrystalline silicon film and the ultra-microcrystalline silicon film secures the film thickness necessary for functioning as the TFT.

Two or more layers of the microcrystalline silicon film and two or more layers of the ultra-microcrystalline silicon film may be stacked on the target object by performing at least two repetitions of alternate execution of the first step and the second step.

Alternatively, the microcrystalline silicon film and the ultra-microcrystalline silicon film may be stacked on the target object so that the ultra-microcrystalline silicon film is sandwiched between the microcrystalline silicon films by executing the first step before and after execution of the second step.

During the first and second steps, a temperature in the vicinity of the target object may be controlled to be 600° C. or less. With this arrangement, the TFT may be formed on the substrate made of glass that is comparatively inexpensive, compared with expensive quartz. Manufacturing cost may be thereby reduced.

Using the film formation method described above, the microcrystalline silicon film is formed on the substrate by the high electron density plasma of the predetermined electron temperature or less. Then, using the high electron density plasma of the electron temperature higher than the predetermined electron temperature, the energy of the ions to be radiated onto the substrate is increased. As a result, the ultra-microcrystalline silicon film may be formed. With this arrangement, the TFT that has the stacked-layer film including the ultra-microcrystalline silicon film as an active layer may be manufactured.

The electrical and physical bonding between the crystal grains in the horizontal direction is thus strengthened by the stacked-layer film of the microcrystalline film and the ultra-microcrystalline film. The operation characteristics of the TFT may be thereby improved. Further, the substrate, which is the base of the microcrystalline silicon film may be prevented from being etched by the chemical solution. The TFT may be thereby stably manufactured.

Further, as described above, by using as the active layer the stacked-layer film obtained by performing repetitions of alternate stacking of the microcrystalline silicon film and the ultra-microcrystalline silicon film a plurality of times as shown in experimental results in FIG. 10, the TFT with more enhanced operation characteristics may be manufactured.

Further, a manufacturing device that manufactures the TFT using the film formation method described above may be constructed.

Further, by incorporating the TFT manufactured by the manufacturing device into a display device, a self light-emitting display device capable of performing high-speed processing with low power consumption may be manufactured.

As described above, according to each embodiment of the present invention, the TFT with enhanced electrical and physical characteristics may be manufactured.

It should be understood by those skilled in the art that various modifications, combinations, sub-combinations and alterations may occur depending on design requirements and other factors insofar as they are within the scope of the appended claims or the equivalents thereof.

In each of the embodiments described above, for example, the manufacturing process of the TFT with the bottom-gate structure was used as an example. The present invention may also be applied to a method of manufacturing a TFT with a top-gate structure where a gate electrode is arranged opposite to the silicon substrate, as seen from the microcrystalline silicon film.

The stacked-layer film according to the present invention may be used for a solar battery as well. The solar battery with a high conversion efficiency may be thereby manufactured.

What is claimed is:

1. A film formation method of forming a film used for at least one of an n-channel thin-film transistor, a p-channel thin-film transistor, and a solar battery, comprising:
    a first step of forming a microcrystalline silicon film by high electron density plasma of a predetermined electron temperature or less; and
    a second step of forming an ultra-microcrystalline silicon film by high electron density plasma of an electron temperature higher than the predetermined electron temperature.

2. The film formation method according to claim 1, wherein
    the first and second steps are executed in a same processing container; and
    a pressure inside the processing container in the second step is set to be lower than a pressure inside the processing container in the first step.

3. The film formation method according to claim 1, wherein
    in the first step, the microcrystalline silicon film is formed by the high electron density plasma having a higher electron density than in the second step.

4. The film formation method according to claim 1, wherein
    in the first step, the microcrystalline silicon film is formed by the high electron density plasma having a larger amount of hydrogen radicals than in the second step.

5. The film formation method according to claim 3, wherein power to be supplied into the processing container in the first step is set to be higher than power to be supplied into the processing container in the second step.

6. The film formation method according to claim 1, wherein
    the predetermined electron temperature is 4.5 eV or less.

7. The film formation method according to claim 1, wherein
    an electron density in the second step is $5 \times 10^{10}$ cm$^{-3}$ or higher.

8. The film formation method according to claim 1, wherein
    process conditions of each step are set so that the ultra-microcrystalline film formed in the second step is formed to be denser than the microcrystalline film formed in the first step.

9. The film formation method according to claim 1, wherein
    process conditions of each step are set so that the ultra-microcrystalline film formed in the second step has smaller crystal grains than the microcrystalline film formed in the first step.

10. The film formation method according to claim 1, wherein
    process conditions of each step are set so that the microcrystalline film formed in the first step has a higher crystal volume fraction than the ultra-microcrystalline film formed in the second step.

11. The film formation method according to claim 1, wherein
    the high electron density plasma is generated by exciting desired gases using an inductively coupled plasma processing apparatus or a microwave plasma processing apparatus.

12. The film formation method according to claim 1, wherein
    in the microwave plasma processing apparatus, a microwave is passed through each of a plurality of dielectric plates shaped into tiles, thereby supplying the microwave into the processing container.

13. The film formation method according to claim 1, wherein
    by performing at least two repetitions of alternate execution of the first step and the second step, two or more layers of the microcrystalline silicon film and two or more layers of the ultra-microcrystalline silicon film are stacked on a target object.

14. The film formation method according to claim 13, wherein
    each of the microcrystalline silicon film and the ultra-microcrystalline silicon film is stacked on the target object so that said each of the microcrystalline silicon film and the ultra-microcrystalline silicon film has a film thickness necessary for functioning as the thin-film transistor and the film thickness of said each of the microcrystalline and ultra-microcrystalline silicon films is the thinnest.

15. The film formation method according to claim 1, wherein
the microcrystalline silicon film and the ultra-microcrystalline silicon film are stacked on the target object so that the ultra-microcrystalline silicon film is sandwiched between the microcrystalline silicon films by execution of the first step before and after execution of the second step.

16. The film formation method according to claim 1, wherein
during the first and second steps, a temperature in the vicinity of the target object is controlled to be 600° C. or less.

* * * * *